United States Patent
Nishihara et al.

(10) Patent No.: US 9,595,941 B2
(45) Date of Patent: Mar. 14, 2017

(54) FILTER AND DUPLEXER WITH RESONATORS HAVING INSERTION FILMS OF DIFFERENT WIDTHS

(71) Applicant: TAIYO YUDEN CO., LTD., Tokyo (JP)

(72) Inventors: Tokihiro Nishihara, Tokyo (JP); Tsuyoshi Yokoyama, Tokyo (JP); Takeshi Sakashita, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/734,979

(22) Filed: Jun. 9, 2015

(65) Prior Publication Data

US 2016/0028371 A1   Jan. 28, 2016

(30) Foreign Application Priority Data

Jul. 25, 2014   (JP) .................. 2014-151633

(51) Int. Cl.
*H03H 9/70* (2006.01)
*H03H 9/54* (2006.01)
*H03H 9/02* (2006.01)
*H03H 9/205* (2006.01)
*H03H 3/04* (2006.01)
(Continued)

(52) U.S. Cl.
CPC .............. *H03H 9/706* (2013.01); *H03H 3/04* (2013.01); *H03H 9/02118* (2013.01); *H03H 9/173* (2013.01); *H03H 9/175* (2013.01); *H03H 9/205* (2013.01); *H03H 9/54* (2013.01); *H03H 9/605* (2013.01); *H03H 2003/0428* (2013.01)

(58) Field of Classification Search
CPC ............ H03H 9/02015; H03H 9/0211; H03H 9/02118; H03H 9/173; H03H 9/174; H03H 9/175; H03H 9/205; H03H 9/54; H03H 9/587; H03H 9/588; H03H 9/589; H03H 9/605; H03H 9/706; H03H 3/04; H03H 2003/0428
USPC ......................... 333/133, 187, 189
See application file for complete search history.

(56) References Cited

U.S. PATENT DOCUMENTS

| | | | |
|---|---|---|---|
| 5,726,610 A * | 3/1998 | Allen .................. | H03H 9/6483 310/313 B |
| 7,388,454 B2 * | 6/2008 | Ruby ...................... | H03H 3/02 310/322 |

(Continued)

FOREIGN PATENT DOCUMENTS

| JP | 2013-123184 A | 6/2013 |
|---|---|---|
| JP | 2014-161001 A | 9/2014 |

*Primary Examiner* — Barbara Summons
(74) *Attorney, Agent, or Firm* — Chen Yoshimura LLP

(57) ABSTRACT

A filter includes: piezoelectric thin film resonators, each including a substrate, a piezoelectric film located on the substrate, a lower electrode and an upper electrode facing each other across at least a part of the piezoelectric film, and an insertion film inserted in the piezoelectric film, located in at least a part of an outer peripheral region within a resonance region, and not located in a center region of the resonance region, the resonance region being a region where the lower electrode and the upper electrode face each other across the piezoelectric film, wherein at least two piezoelectric thin film resonators out of the piezoelectric thin film resonators have different widths of the insertion films within the resonance regions.

10 Claims, 19 Drawing Sheets

(51) Int. Cl.
*H03H 9/17* (2006.01)
*H03H 9/60* (2006.01)

(56) References Cited

U.S. PATENT DOCUMENTS

| | | | | |
|---|---|---|---|---|
| 8,084,919 B2* | 12/2011 | Nishihara | .......... | H03H 9/02 118 |
| | | | | 310/320 |
| 9,344,059 B2* | 5/2016 | Nishihara | ................ | H03H 9/70 |
| 9,356,573 B2* | 5/2016 | Yokoyama | .............. | H01L 41/18 |
| 2004/0135144 A1* | 7/2004 | Yamada | ............. | H03H 9/02 094 |
| | | | | 257/59 |
| 2010/0039000 A1* | 2/2010 | Milson | ............... | H03H 9/02 228 |
| | | | | 310/366 |
| 2012/0218060 A1* | 8/2012 | Burak | ..................... | H03H 3/04 |
| | | | | 333/191 |
| 2013/0127565 A1* | 5/2013 | Nishihara | .......... | H03H 9/02 102 |
| | | | | 333/133 |
| 2013/0147577 A1 | 6/2013 | Nishihara et al. | | |
| 2013/0241673 A1* | 9/2013 | Yokoyama | ......... | H03H 9/02 015 |
| | | | | 333/189 |
| 2014/0210570 A1 | 7/2014 | Nishihara et al. | | |

* cited by examiner

FIG. 8

|  | RESO-NATOR | DUP0 | | | |
| --- | --- | --- | --- | --- | --- |
|  |  | ELECTRO-STATIC CAPACITANCE [pF] | K²eff [%] | WIDTH W [μm] | RESONANT FREQUENCY [MHz] |
| TRANSMIT FILTER 62 | ST1 | 3.5 | 7.3 | 3 | 1871 |
|  | ST2 | 2.1 | 7.1 | 3 | 1886 |
|  | ST3 | 1.2 | 6.9 | 3 | 1891 |
|  | ST4 | 3.4 | 7.3 | 3 | 1872 |
|  | ST5 | 2.7 | 7.2 | 3 | 1875 |
|  | PT1 | 2.5 | 7.2 | 3 | 1819 |
|  | PT2 | 0.5 | 6.6 | 3 | 1805 |
|  | PT3 | 0.5 | 6.6 | 3 | 1805 |
|  | PT4 | 3.0 | 7.3 | 3 | 1825 |
| RECEIVE FILTER 64 | SR1 | 1.6 | 7.0 | 3 | 1974 |
|  | SR2 | 1.1 | 6.9 | 3 | 1978 |
|  | SR3 | 0.8 | 6.7 | 3 | 1966 |
|  | SR4 | 2.2 | 7.1 | 3 | 1955 |
|  | PR1 | 3.5 | 7.3 | 3 | 1902 |
|  | PR2 | 1.6 | 7.0 | 3 | 1916 |
|  | PR3 | 1.6 | 7.0 | 3 | 1902 |
|  | PR4 | 0.5 | 6.6 | 3 | 1905 |

FIG. 9

| | RESO-NATOR | DUP1 | | | |
|---|---|---|---|---|---|
| | | ELECTRO-STATIC CAPACITANCE [pF] | $K^2_{eff}$ [%] | WIDTH W [μm] | RESONANT FREQUENCY [MHz] |
| TRANSMIT FILTER 62 | ST1 | 3.5 | 7.9 | 6 | 1867 |
| | ST2 | 1.5 | 7.3 | 7 | 1888 |
| | ST3 | 3.4 | 6.6 | 14 | 1888 |
| | ST4 | 2.0 | 6.1 | 16 | 1880 |
| | ST5 | 3.0 | 8.2 | 3 | 1669 |
| | PT1 | 2.3 | 8.1 | 3 | 1813 |
| | PT2 | 0.7 | 5.7 | 17 | 1797 |
| | PT3 | 0.5 | 5.6 | 17 | 1797 |
| | PT4 | 3.3 | 8.3 | 3 | 1817 |
| RECEIVE FILTER 64 | SR1 | 1.8 | 8.0 | 3 | 1974 |
| | SR2 | 1.7 | 6.0 | 16 | 1991 |
| | SR3 | 1.4 | 6.3 | 14 | 1971 |
| | SR4 | 0.7 | 7.7 | 3 | 1971 |
| | PR1 | 2.4 | 6.2 | 16 | 1911 |
| | PR2 | 1.3 | 7.1 | 9 | 1916 |
| | PR3 | 1.7 | 8.0 | 3 | 1902 |
| | PR4 | 1.4 | 7.9 | 3 | 1911 |

FIG. 10

|  | RESO-NATOR | DUP2 | | | |
| --- | --- | --- | --- | --- | --- |
|  |  | ELECTRO-STATIC CAPACITANCE [pF] | K²eff [%] | WIDTH W [μm] | RESONANT FREQUENCY [MHz] |
| TRANSMIT FILTER 62 | ST1 | 2.9 | 8.4 | 8 | 1866 |
|  | ST2 | 2.8 | 5.2 | 26 | 1887 |
|  | ST3 | 3.5 | 5.9 | 23 | 1883 |
|  | ST4 | 1.4 | 6.8 | 16 | 1881 |
|  | ST5 | 2.8 | 9.2 | 3 | 1867 |
|  | PT1 | 2.6 | 9.2 | 3 | 1807 |
|  | PT2 | 0.6 | 4.6 | 28 | 1789 |
|  | PT3 | 0.7 | 4.7 | 28 | 1789 |
|  | PT4 | 3.5 | 9.3 | 3 | 1809 |
| RECEIVE FILTER 64 | SR1 | 1.6 | 9.0 | 3 | 1971 |
|  | SR2 | 2.2 | 5.1 | 27 | 1981 |
|  | SR3 | 1.4 | 6.1 | 20 | 1960 |
|  | SR4 | 0.7 | 7.8 | 8 | 1969 |
|  | PR1 | 2.7 | 5.2 | 26 | 1913 |
|  | PR2 | 0.9 | 6.5 | 17 | 1916 |
|  | PR3 | 2.2 | 7.8 | 11 | 1898 |
|  | PR4 | 1.4 | 8.9 | 3 | 1907 |

FIG. 11

| RESO-NATOR | | DUP3 | | | |
|---|---|---|---|---|---|
| | | ELECTRO-STATIC CAPACITANCE [pF] | $K^2_{eff}$ [%] | WIDTH W [μm] | RESONANT FREQUENCY [MHz] |
| TRANSMIT FILTER 62 | ST1 | 2.8 | 8.4 | 13 | 1865 |
| | ST2 | 3.3 | 5.4 | 29 | 1886 |
| | ST3 | 3.5 | 4.6 | 33 | 1886 |
| | ST4 | 1.4 | 7.0 | 19 | 1881 |
| | ST5 | 2.5 | 10.2 | 3 | 1865 |
| | PT1 | 2.9 | 10.2 | 3 | 1800 |
| | PT2 | 0.5 | 3.6 | 37 | 1786 |
| | PT3 | 0.8 | 3.8 | 36 | 1786 |
| | PT4 | 3.5 | 9.9 | 5 | 1806 |
| RECEIVE FILTER 64 | SR1 | 1.6 | 9.4 | 6 | 1970 |
| | SR2 | 2.1 | 4.1 | 35 | 1979 |
| | SR3 | 1.4 | 6.5 | 22 | 1958 |
| | SR4 | 0.7 | 7.7 | 14 | 1970 |
| | PR1 | 2.3 | 4.7 | 32 | 1916 |
| | PR2 | 1.3 | 6.0 | 24 | 1915 |
| | PR3 | 2.1 | 7.7 | 16 | 1898 |
| | PR4 | 1.5 | 10.0 | 3 | 1902 |

FIG. 12

| RESO-NATOR | DUP4 | | | |
|---|---|---|---|---|
| | ELECTRO-STATIC CAPACITANCE [pF] | $K^2_{eff}$ [%] | WIDTH W [μm] | RESONANT FREQUENCY [MHz] |
| ST1 | 2.6 | 8.6 | 15 | 1865 |
| ST2 | 3.5 | 5.3 | 31 | 1887 |
| ST3 | 3.5 | 4.6 | 35 | 1887 |
| ST4 | 1.6 | 6.3 | 26 | 1883 |
| ST5 | 2.0 | 11.1 | 6 | 1865 |
| PT1 | 3.1 | 11.0 | 4 | 1796 |
| PT2 | 0.5 | 3.8 | 37 | 1787 |
| PT3 | 0.7 | 2.7 | 43 | 1787 |
| PT4 | 3.5 | 9.8 | 10 | 1807 |
| SR1 | 1.6 | 9.7 | 9 | 1969 |
| SR2 | 2.3 | 3.6 | 39 | 1976 |
| SR3 | 1.3 | 7.3 | 21 | 1956 |
| SR4 | 0.8 | 7.1 | 21 | 1972 |
| PR1 | 2.3 | 4.8 | 34 | 1916 |
| PR2 | 1.4 | 5.3 | 31 | 1915 |
| PR3 | 2.1 | 7.5 | 20 | 1899 |
| PR4 | 1.7 | 11.0 | 3 | 1895 |

(Rows ST1–PT4: TRANSMIT FILTER 62; Rows SR1–PR4: RECEIVE FILTER 64)

FILTER AND DUPLEXER WITH RESONATORS HAVING INSERTION FILMS OF DIFFERENT WIDTHS

CROSS-REFERENCE TO RELATED APPLICATION

This application is based upon and claims the benefit of priority of the prior Japanese Patent Application No. 2014-151633, filed on Jul. 25, 2014, the entire contents of which are incorporated herein by reference.

FIELD

A certain aspect of the present invention relates to a filter and a duplexer.

BACKGROUND

Acoustic wave devices employing a piezoelectric thin film resonator are used as filters and duplexers of wireless devices such as mobile phones. The piezoelectric thin film resonator has a structure designed to have a lower electrode and an upper electrode facing each other across a piezoelectric film. A region where the lower electrode and the upper electrode face each other across the piezoelectric film is a resonance region.

Rapid diffusion of mobile phones leads to the use of many frequency bands. This requires the filter and the duplexer to have sharp skirt characteristics. For example, a filter employed in a duplexer having a narrow guard band, which is a frequency band between a transmit band and a receive band, is required to have sharp characteristics of the filter.

Japanese Patent Application Publication No. 2013-123184 (Patent Document 1) discloses providing a thick film portion having a thick multilayered film in the outer periphery of the resonance region of a piezoelectric thin film resonator and making widths of the thick film portions from the edges of the resonance regions different from each other between at least two piezoelectric thin film resonators in the filter to achieve sharp skirt characteristics.

Making the widths of the thick film portions of the resonators different from each other enables to make effective electromechanical coupling coefficients different from each other. This enables to achieve sharp skirt characteristics. However, in the structure disclosed in Patent Document 1, the capacitor of the thick film portion does not have a high Q-value, and thus skirt characteristics are not sufficiently sharp.

SUMMARY OF THE INVENTION

According to an aspect of the present invention, there is provided a filter including: piezoelectric thin film resonators, each including a substrate, a piezoelectric film located on the substrate, a lower electrode and an upper electrode facing each other across at least a part of the piezoelectric film, and an insertion film inserted in the piezoelectric film, located in at least a part of an outer peripheral region within a resonance region, and not located in a center region of the resonance region, the resonance region being a region where the lower electrode and the upper electrode face each other across the piezoelectric film, wherein at least two piezoelectric thin film resonators out of the piezoelectric thin film resonators have different widths of the insertion films within the resonance regions.

According to another aspect of the present invention, there is provided a duplexer including: a transmit filter; and a receive filter, wherein at least one of the transmit filter and the receive filter is the above filter.

BRIEF DESCRIPTION OF THE DRAWINGS

FIG. 8 is a diagram listing characteristics of resonators of a duplexer DUP0;

FIG. 9 is a diagram listing characteristics of resonators of a duplexer DUP1;

FIG. 10 is a diagram listing characteristics of resonators of a duplexer DUP2;

FIG. 11 is a diagram listing characteristics of resonators of a duplexer DUP3;

FIG. 12 is a diagram listing characteristics of resonators of a duplexer DUP4;

DETAILED DESCRIPTION

A description will now be given of embodiments of the present invention with reference to attached drawings.

First Embodiment

Figure 1:
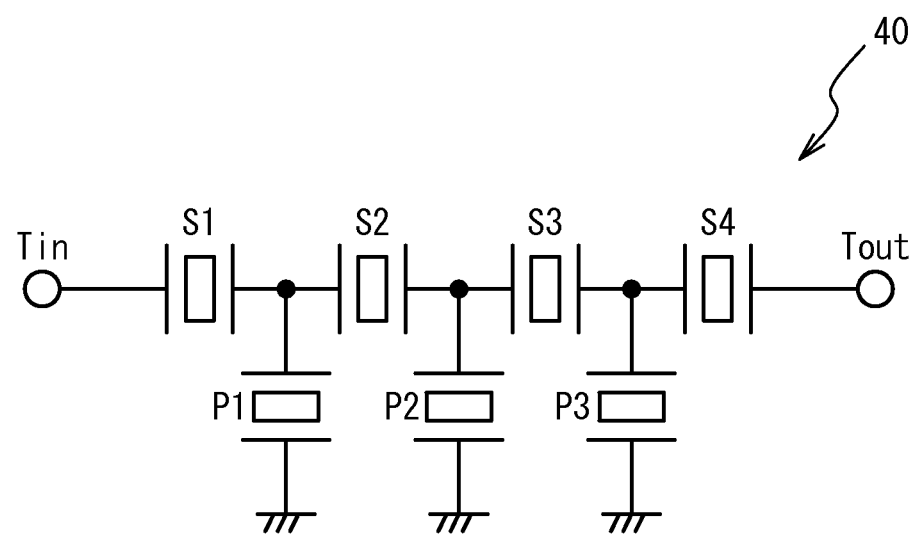
FIG. 1 is a circuit diagram of a filter in accordance with a first embodiment.

A first embodiment is an exemplary ladder-type filter. FIG. 1 is a circuit diagram of a filter in accordance with the first embodiment. As illustrated in FIG. 1, a filter 40 of the first embodiment includes one or more series resonators S1 through S4 and one or more parallel resonators P1 through P3. The series resonators S1 through S4 are connected in series between an input terminal Tin and an output terminal Tout. The parallel resonators P1 through P3 are connected in parallel between the input terminal Tin and the output terminal Tout. The connection and the number of the series resonator and the parallel resonator can be freely selected.

Figure 2A:
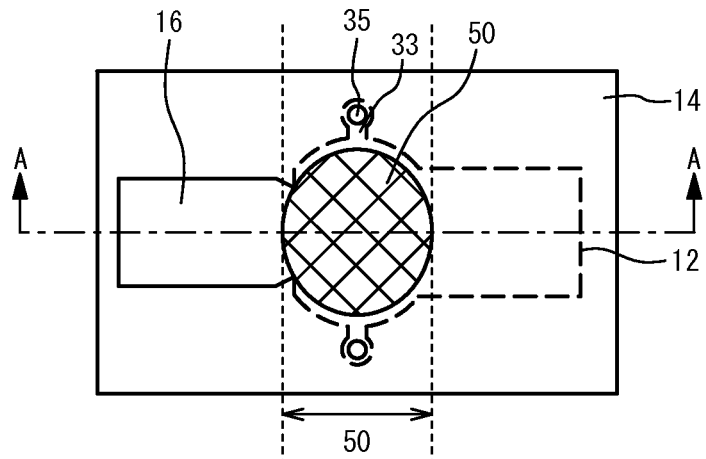
FIG. 2A is a plan view of a piezoelectric thin film resonator employed in the first embodiment.
Figure 2B:
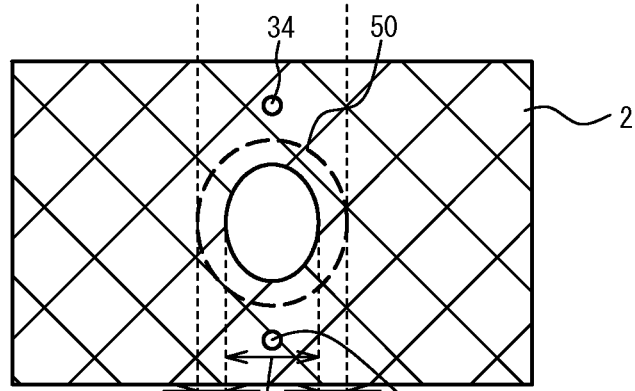
FIG. 2B is a plan view of an insertion film.
Figure 2C:
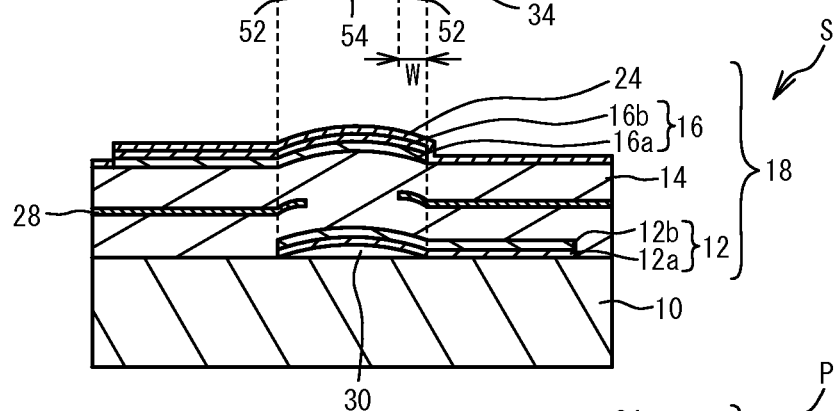
FIG. 2C and FIG. 2D are cross-sectional views taken along line A-A in FIG. 2A.
Figure 2D:
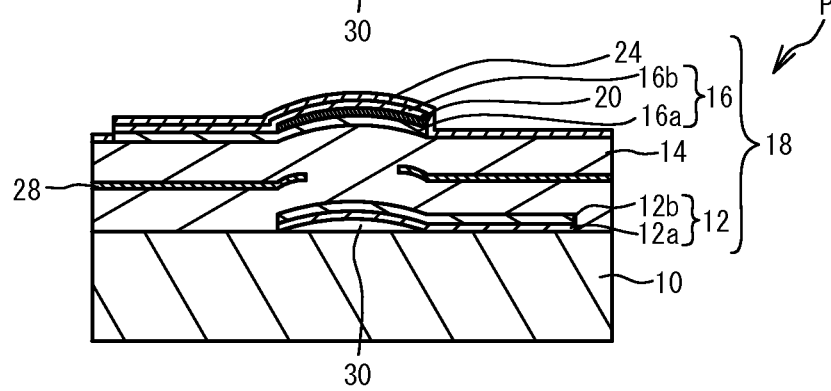

FIG. 2A is a plan view of a piezoelectric thin film resonator employed in the first embodiment, FIG. 2B is a plan view of an insertion film, and FIG. 2C and FIG. 2D are cross-sectional views taken along line A-A in FIG. 2A. FIG. 2C is a cross-sectional view of the series resonators S1 through S4 of the filter 40, and FIG. 2D is a cross-sectional view of the parallel resonators P1 through P3 of the filter 40.

With reference to FIG. 2A and FIG. 2C, a structure of the series resonator S will be explained. A lower electrode 12 is formed on a substrate 10 that is a silicon (Si) substrate. An air-space 30 having a dome-shaped bulge is formed between the flat principal surface of the substrate 10 and the lower electrode 12. The dome-shaped bulge has a shape in which the height of the air-space 30 is low in the periphery of the air-space 30 and the height of the air-space 30 increases at closer distance to the center of the air-space 30. The lower electrode 12 includes a lower layer 12a and an upper layer 12b. The lower layer 12a is, for example, a chrome (Cr) film, and the upper layer 12b is, for example, a ruthenium (Ru) film.

On the lower electrode 12, formed is a piezoelectric film 14 mainly composed of aluminum nitride (AlN) having the main axis in the (002) direction. An insertion film 28 is formed in the piezoelectric film 14. An upper electrode 16 is formed on the piezoelectric film 14 so as to have a region (a resonance region 50) facing the lower electrode 12 across the piezoelectric film 14. The resonance region 50 is a region having a shape of an ellipse and in which an acoustic wave in a thickness extension mode resonates. The upper electrode 16 includes a lower layer 16a and an upper layer 16b. The lower layer 16a is, for example, a Ru film, and the upper layer 16b is, for example, a Cr film.

A silicon oxide film as a frequency adjusting film 24 is formed on the upper electrode 16. A multilayered film 18 within the resonance region 50 includes the lower electrode 12, the piezoelectric film 14, the insertion film 28, the upper electrode 16, and the frequency adjusting film 24. The frequency adjusting film 24 may act as a passivation film.

As illustrated in FIG. 2A, an introduction path 33 is formed in the lower electrode 12 to etch a sacrifice layer. The sacrifice layer is a layer for forming the air-space 30. The tip of the introduction path 33 is not covered with the piezoelectric film 14, and the lower electrode 12 has a hole portion 35 at the tip of the introduction path 33.

With reference to FIG. 2A and FIG. 2D, a structure of the parallel resonator P will be described. Compared to the series resonator S, the parallel resonator P includes a mass load film 20 formed of a titanium (Ti) layer between the lower layer 16a and the upper layer 16b of the upper electrode 16. Thus, the multilayered film 18 includes the mass load film 20 formed across the entire surface within the resonance region 50 in addition to the multilayered film of the series resonator S. Other structures are the same as those of the series resonator S of FIG. 2C, and thus the description is omitted.

A difference in the resonant frequency between the series resonator S and the parallel resonator P is adjusted by the film thickness of the mass load film 20. The resonant frequencies of the series resonator S and the parallel resonator P are adjusted by adjusting the film thickness of the frequency adjusting film 24.

When the piezoelectric thin film resonator has a resonant frequency of 2 GHz, the lower layer 12a, which is made of a Cr film, of the lower electrode 12 has a film thickness of 100 nm, and the upper layer 12b, which is made of a Ru film, has a film thickness of 250 nm. The piezoelectric film 14 made of an AlN film has a film thickness of 1100 nm. The insertion film 28 made of an aluminum (Al) film has a film thickness of 150 nm. The lower layer 16a, which is made of a Ru film, of the upper electrode 16 has a film thickness of 250 nm, and the upper layer 16b made of a Cr film has a film thickness of 50 nm. The frequency adjusting film 24 made of a silicon oxide film has a film thickness of 50 nm. The mass load film 20 made of a Ti film has a film thickness of 120 nm. The film thickness of each layer can be appropriately set to obtain desired resonance characteristics.

As illustrated in FIG. 2B, the insertion film 28 is located in an outer peripheral region 52 within the resonance region 50, but is not located in a center region 54. The outer peripheral region 52 is a region within the resonance region 50, and is a region including the outer periphery of the resonance region 50 and being along the outer periphery. The outer peripheral region 52 is, for example, strip-shaped or ring shaped. The center region 54 is a region within the resonance region 50, and is a region including the center of the resonance region 50. The center may not be a geometric center. The insertion film 28 is continuously located from the outer peripheral region 52 to the outside of the resonance region 50. A hole portion 34 corresponding to the hole portion 35 is formed in the insertion film 28.

Instead of the Si substrate, the substrate 10 may be a quartz substrate, a glass substrate, a ceramic substrate, or a GaAs substrate. The lower electrode 12 and the upper electrode 16 may be made of a single-layer film of Al, Ti, copper (Cu), molybdenum (Mo), tungsten (W), tantalum (Ta), platinum (Pt), rhodium (Rh), or iridium (Ir), or a multilayered film of them, instead of Ru and Cr. When the upper electrode 16 is made of a multilayered film, the insertion film 28 may be located on the boundary face of the multilayered film. For example, the lower layer 16a of the upper electrode 16 may be made of Ru, and the upper layer 16b may be made of Mo.

The piezoelectric film 14 may be made of zinc oxide (ZnO), lead zirconate titanate (PZT), or lead titanate (Pb-TiO$_3$) instead of aluminum nitride. In addition, the piezoelectric film 14 may be mainly composed of aluminum nitride, and may include other elements to improve the resonance characteristics or improve the piezoelectricity. For example, the usage of scandium (Sc), two elements of divalent and quadrivalent elements, or two elements of divalent and pentavalent elements as the additive elements improves the piezoelectricity of the piezoelectric film 14. This improves the effective electromechanical coupling coefficient of the piezoelectric thin film resonator. The divalent element is, for example, calcium (Ca), magnesium (Mg), strontium (Sr), or zinc (Zn). The quadrivalent element is, for example, Ti, zirconium (Zr), or hafnium (Hf). The pentavalent element is, for example, Ta, niobium (Nb), or vanadium (V).

The frequency adjusting film 24 may be made of a silicon nitride film, or aluminum nitride instead of a silicon oxide film. The mass load film 20 may be made of a single-layer film of Ru, Cr, Al, Cu, Mo, W, Ta, Pt, Rh, or Jr instead of Ti. In addition, an insulating film made of metal nitride such as silicon nitride or metal oxide such as silicon oxide may be used. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers, which are the lower layer 16a and the upper layer 16b, of the upper electrode 16. The mass load film 20 may be larger than the resonance region 50 as long as it is formed so as to include the resonance region 50.

Figure 3A:
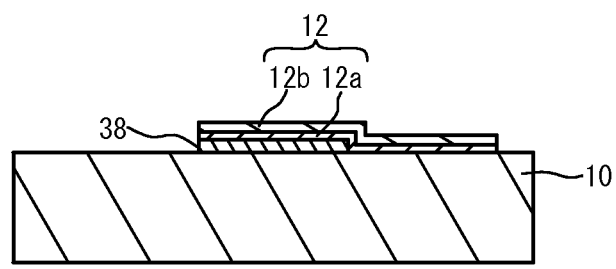
FIG. 3A through FIG. 3C are cross-sectional views illustrating a method of fabricating a series resonator of the first embodiment.
Figure 3B:
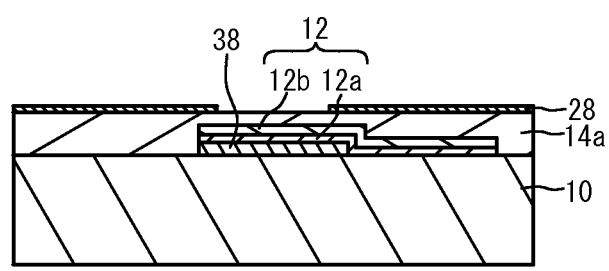
Figure 3C:
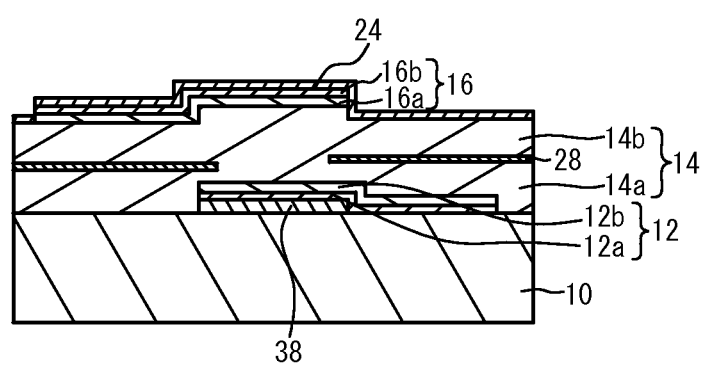

FIG. 3A through FIG. 3C are cross-sectional views illustrating a method of fabricating the series resonator of the first embodiment. As illustrated in FIG. 3A, a sacrifice layer 38 for forming an air-space is formed on the substrate 10 having a flat principal surface. The sacrifice layer 38 has a film thickness of, for example, 10 to 100 nm, and is made of a material selected from materials such as magnesium oxide (MgO), ZnO, germanium (Ge), and silicon oxide ($SiO_2$), which are easily dissolved in etching liquid or etching gas. The sacrifice layer 38 is then patterned into a desired shape by photolithography and etching. The sacrifice layer 38 has a shape corresponding to the planar shape of the air-space 30, and includes, for example, a region to be the resonance region 50. The lower layer 12a and the upper layer 12b are then formed on the sacrifice layer 38 and the substrate 10 as the lower electrode 12. The sacrifice layer 38 and the lower electrode 12 are formed by, for example, sputtering, vacuum evaporation, or Chemical Vapor Deposition (CVD). The lower electrode 12 is then patterned into a desired shape by photolithography and etching. The lower electrode 12 may be formed by liftoff.

As illustrated in FIG. 3B, a piezoelectric film 14a and the insertion film 28 are formed on the lower electrode 12 and the substrate 10 by, for example, sputtering, vacuum evaporation, or CVD. The insertion film 28 is patterned into a desired shape by photolithography and etching. The insertion film 28 may be formed by liftoff.

As illustrated in FIG. 3C, a piezoelectric film 14b, and the lower layer 16a and the upper layer 16b of the upper electrode 16 are formed by, for example, sputtering, vacuum evaporation, or CVD. The piezoelectric films 14a and 14b form the piezoelectric film 14. The upper electrode 16 is patterned into a desired shape by photolithography and etching. The upper electrode 16 may be formed by liftoff.

In the parallel resonator illustrated in FIG. 2D, the mass load film 20 is formed by, for example, sputtering, vacuum evaporation, or CVD after the lower layer 16a is formed. The mass load film 20 is patterned into a desired shape by photolithography and etching. The upper layer 16b is then formed.

The frequency adjusting film 24 is formed by, for example, sputtering or CVD. The adjusting film 24 is patterned into a desired shape by photolithography and etching.

Then, the etching liquid to etch the sacrifice layer 38 is introduced to the sacrifice layer 38 under the lower electrode 12 through the hole portion 35 and the introduction path 33 (see FIG. 2A). This process removes the sacrifice layer 38. A substance used to etch the sacrifice layer 38 is preferably a substance that does not etch the materials of the resonator except the sacrifice layer 38. Especially, an etching substance is preferably a substance that does not etch the lower electrode 12 that comes in contact with the etching substance. The stress on the multilayered film 18 (see FIG. 2C and FIG. 2D) is set to a compression stress. This allows the multilayered film 18 to bulge out to the opposite side of the substrate 10 so as to separate from the substrate 10 when the sacrifice layer 38 is removed. The air-space 30 having a dome-shaped bulge is formed between the lower electrode 12 and the substrate 10. The above described process completes the series resonator S illustrated in FIG. 2A and FIG. 2C and the parallel resonator P illustrated in FIG. 2A and FIG. 2D.

A Q-value at an anti-resonant frequency was simulated with the finite element method by changing the material of the insertion film 28 in the piezoelectric thin film resonator employed in the first embodiment. The finite element method is performed by a two-dimensional analysis with respect to the cross-section illustrated in FIG. 2C. The film thickness and the material of each layer of the multilayered film 18 were assumed to be the same as those of the corresponding layer of the exemplified piezoelectric thin film resonator having a resonant frequency of 2 GHz illustrated in FIG. 2A through FIG. 2D. That is to say, the piezoelectric film 14 was assumed to be made of AlN. The insertion film 28 was assumed to have a film thickness of 150 nm, and a width W of the insertion film 28 overlapping with the resonance region 50 was assumed to be 2 μm. The insertion film 28 was assumed to be formed in the intermediate position in the film thickness direction of the piezoelectric film 14.

Figure 4A:
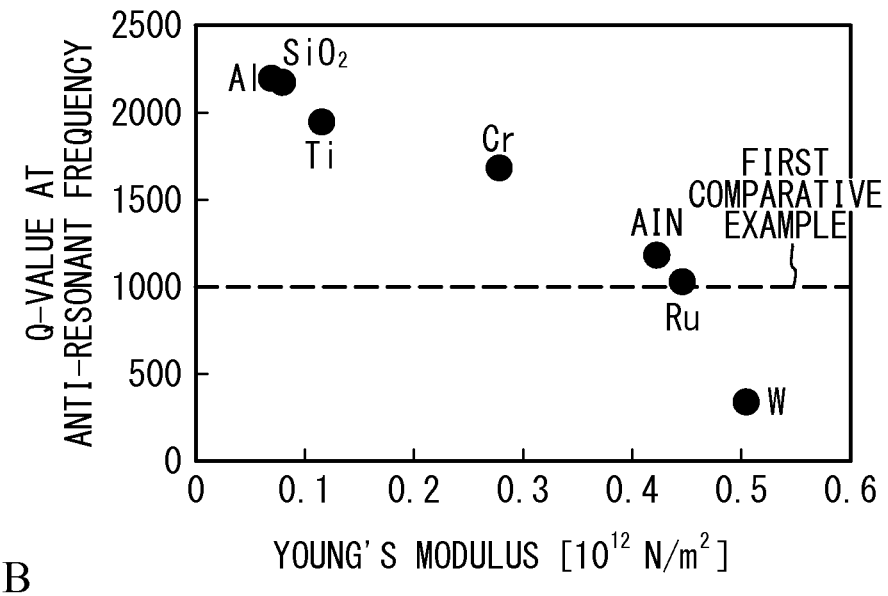
FIG. 4A is a graph of Young's modulus of the insertion film versus Q-value at an anti-resonant frequency.
Figure 4B:
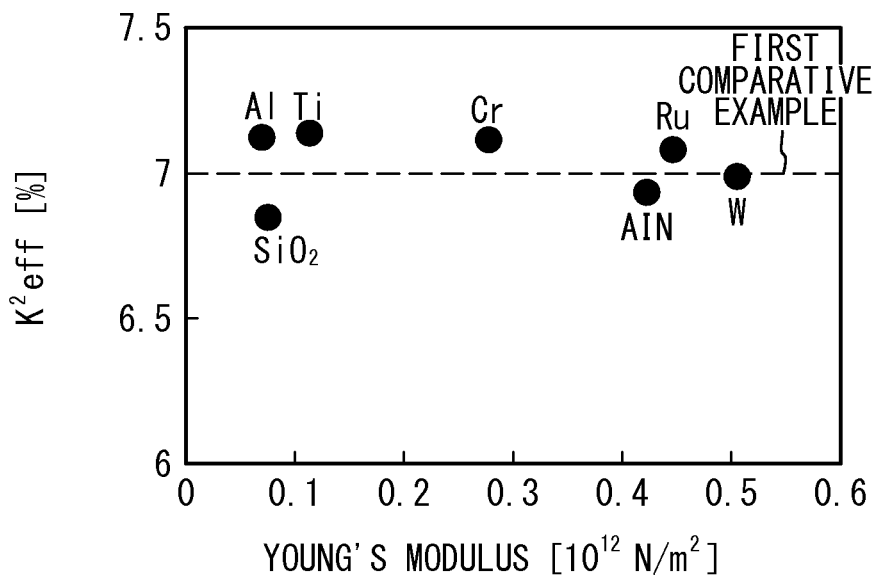
FIG. 4B is a graph of Young's modulus of the insertion film versus effective electromechanical coupling coefficient $k^2$eff.

FIG. 4A is a graph of Young's modulus of the insertion film 28 versus Q-value at the anti-resonant frequency, and FIG. 4B is a graph of Young's modulus of the insertion film 28 versus effective electromechanical coupling coefficient $k^2$eff. The first comparative example corresponds to a resonator without the insertion film 28. The calculation was performed on Al, $SiO_2$, Ti, Cr, AlN, Ru, and W as the material of the insertion film 28.

As illustrated in FIG. 4A, the use of a material having a low Young's modulus for the insertion film 28 makes a Q-value at the anti-resonant frequency high. When a Young's modulus is less than that of AlN, a Q-value is greater than that of the first comparative example. This is because the creation of unnecessary Lamb waves in a lateral mode is prevented and the leakage of the acoustic wave energy to the outside of the resonance region 50 is reduced. The insertion film 28 preferably has a Young's modulus less than that of the piezoelectric film 14. The insertion film 28 preferably has a Young's modulus of 90% or less, and more preferably 80% or less.

As illustrated in FIG. 4B, the effective electromechanical coupling coefficient $k^2$eff is high when the insertion film 28 is made of metal. It is presumed that this is because the electrical field distribution of the acoustic wave in the resonance region 50 becomes uniform when the insertion film 28 is made of metal.

The effective electromechanical coupling coefficient $k^2$eff of the piezoelectric thin film resonator employed in the first embodiment was simulated by varying the width W of the insertion film 28 within the resonance region 50 (see FIG. 2B). The piezoelectric film 14 was assumed to be made of AlN, and the insertion film 28 was assumed to be made of Al. Other conditions for the simulation are the same as those of the simulation in FIG. 4A and FIG. 4B, and thus the description is omitted.

Figure 5:
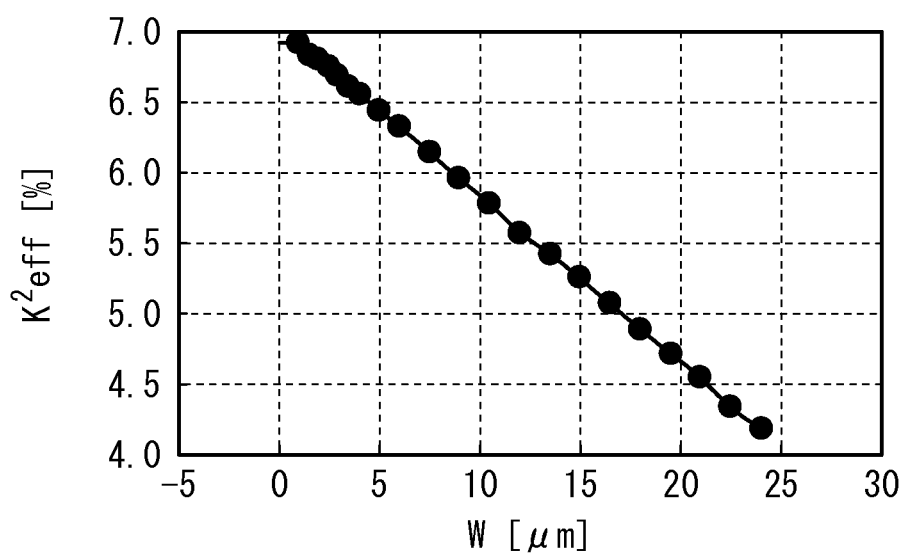
FIG. 5 is a graph of width W versus effective electromechanical coupling coefficient $k^2$eff.

FIG. 5 is a graph of width W versus effective electromechanical coupling coefficient $k^2$eff. As illustrated in FIG. 5, as the width W increases, the effective electromechanical coupling coefficient $k^2$eff monotonically decreases.

Figure 6:
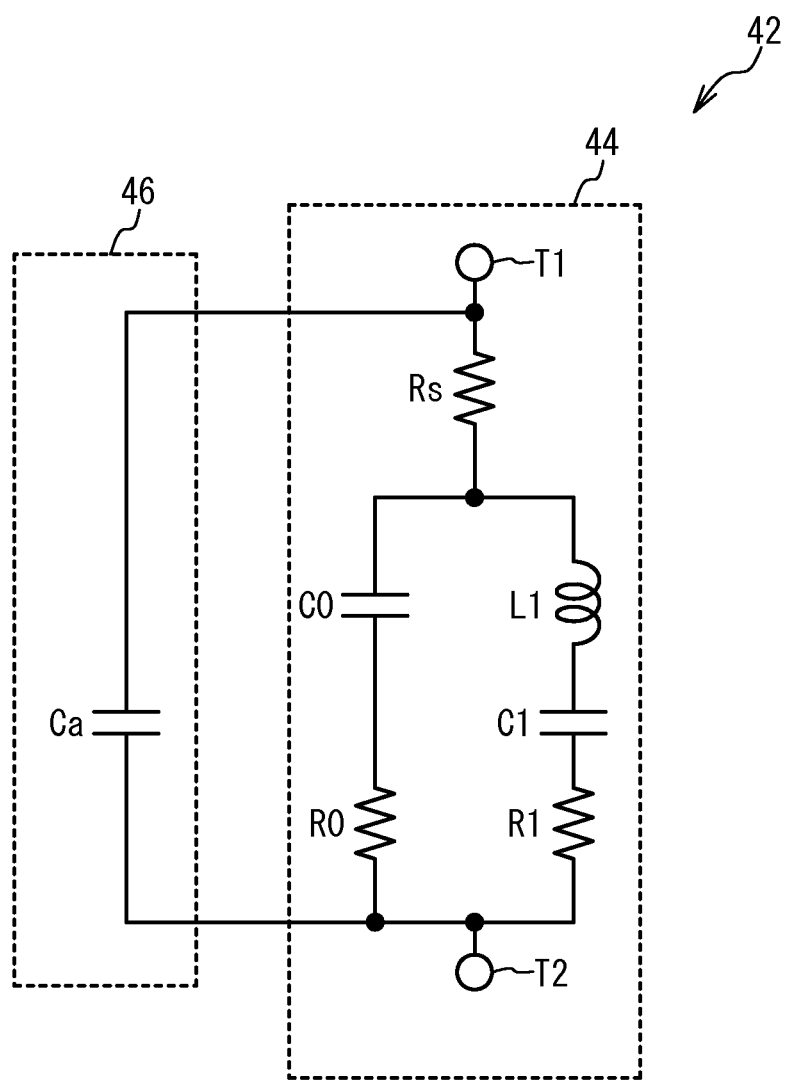
FIG. 6 is a diagram illustrating an equivalent circuit of a piezoelectric thin film resonator including an insertion film.

A description will next be given of a reason why the effective electromechanical coupling coefficient depends on the width W. FIG. 6 is a diagram illustrating an equivalent circuit of a piezoelectric thin film resonator including an insertion film. As illustrated in FIG. 6, a resonator 42 includes a piezoelectric thin film resonator portion 44 and a capacitor portion 46. The piezoelectric thin film resonator portion 44 is a piezoelectric thin film resonator equivalently formed in the center region 54 where the insertion film 28 is not formed. In the piezoelectric thin film resonator portion 44, a resistor Rs, an inductor L1, a capacitor C1, and a resistor R1 are connected in series between terminals T1 and T2. A capacitor C0 and a resistor R0 are connected in parallel to the inductor L1, the capacitor C1, and the resistor R1. The capacitor portion 46 corresponds to a capacitor Ca equivalently formed in the outer peripheral region 52 where the insertion film 28 is formed. Since the region where the insertion film 28 is formed limits the resonance vibration, thus being equivalent to the capacitor Ca. The capacitor portion 46 is connected in parallel to the piezoelectric thin film resonator portion 44 between the terminals T1 and T2. As the width W of the insertion film 28 increases, the capacitance of the capacitor Ca increases. This decreases the anti-resonant frequency. Thus, the effective electromechanical coupling coefficient $k^2$eff decreases. As described above, as the width W increases, the effective electromechanical coupling coefficient $k^2$eff decreases.

As disclosed in Patent Document 1, skirt characteristics of a filter can be made to be sharp by making the effective electromechanical coupling coefficients different from each other between resonators of the filter. To achieve sharp skirt characteristics, the resonator preferably has a high Q-value. However, the capacitor Ca of the thick film portion only has a Q-value of about 20 to 40 in Patent Document 1. On the other hand, the first embodiment allows the capacitor Ca to have a Q-value of 70 or greater. This improves the sharpness of the skirt characteristics of the filter 40.

In addition, the first embodiment uses the width W of the insertion film 28 to control the effective electromechanical coupling coefficient of each resonator, thus less affecting the fabrication process.

Figure 7:
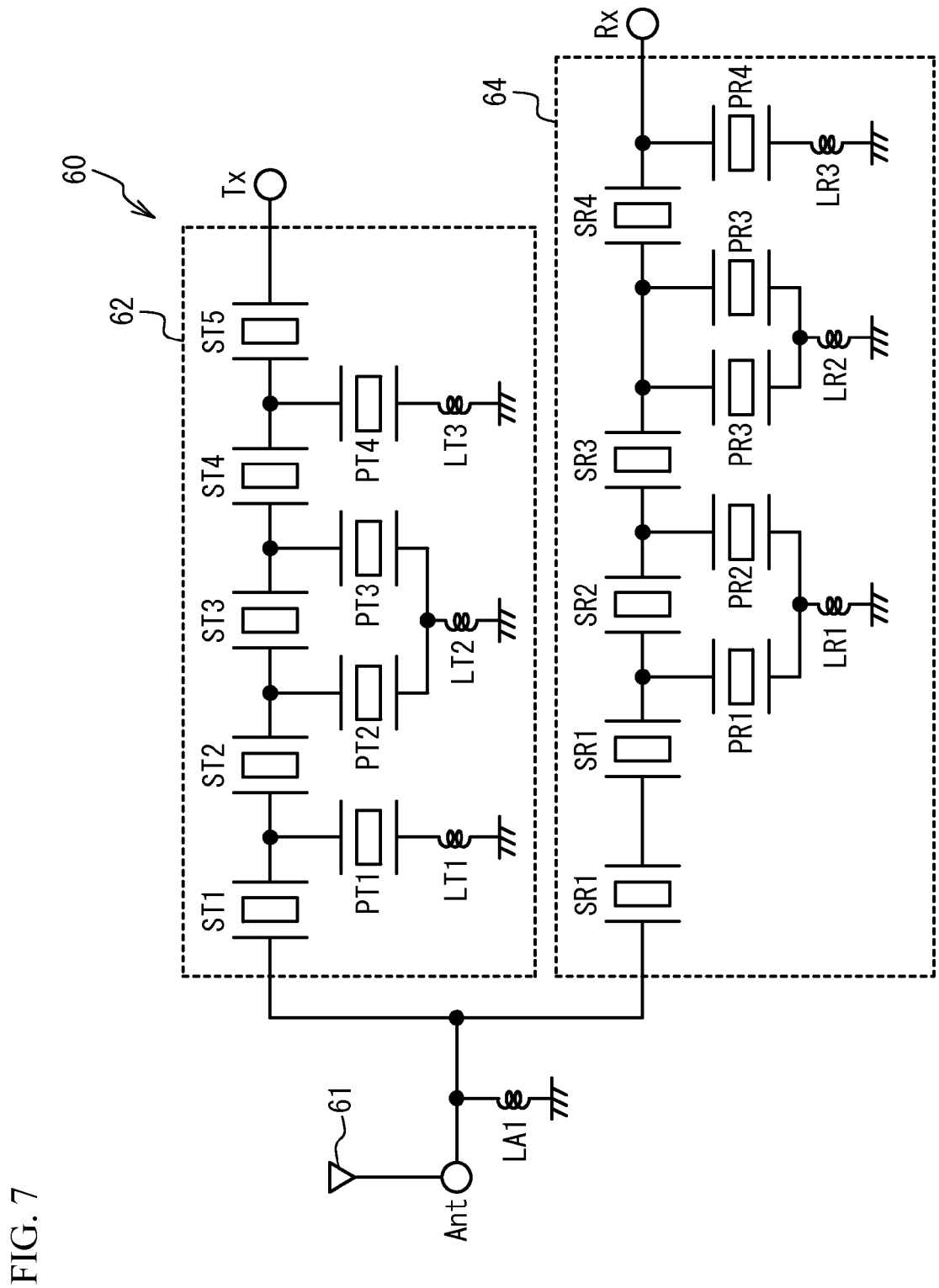
FIG. 7 is a circuit diagram of a simulated duplexer.

A description will next be given of an example of a simulation of a duplexer using the first embodiment. FIG. 7 is a circuit diagram of a simulated duplexer. The duplexer is a duplexer for Band 25 (transmit band: 1850 to 1915 MHz, receive band: 1930 to 1995 MHz). As illustrated in FIG. 7, a duplexer 60 includes a transmit filter 62 and a receive filter 64. The transmit filter 62 is connected between a common terminal Ant and a transmit terminal Tx. The receive filter 64 is connected between the common terminal Ant and a receive terminal Rx. The common terminal Ant is coupled to an antenna 61. An inductor LA1 is connected between the common terminal Ant and a ground.

The transmit filter 62 passes signals in the transmit band out of signals supplied from the transmit terminal Tx as transmission signals to the common terminal Ant, and suppresses signals with other frequencies. The receive filter 64 passes signals in the receive band out of signals supplied from the common terminal Ant as reception signals to the receive terminal Rx, and suppresses signals with other frequencies. The inductor LA1 matches impedance so that the transmission signal transmitted through the transmit filter 62 is output from the common terminal Ant without leaking to the receive filter 64.

In the transmit filter 62, series resonators ST1 through ST5 are connected in series between the common terminal Ant and the transmit terminal Tx. Parallel resonators PT1 through PT4 are connected in parallel between the common terminal Ant and the transmit terminal Tx. An inductor LT1 is connected between the parallel resonator PT1 and a ground, an inductor LT2 is connected between the parallel resonators PT2 and PT3 and a ground, and an inductor LT3 is connected between the parallel resonator PT4 and a ground.

In the receive filter 64, series resonators SR1 through SR4 are connected in series between the common terminal Ant and the receive terminal Rx. Parallel resonators PR1 through PR4 are connected in parallel between the common terminal Ant and the receive terminal Rx. An inductor LR1 is connected between the parallel resonators PR1 and PR2 and a ground, an inductor LR2 is connected between the parallel resonators PR3 and a ground, and an inductor LR3 is connected between the parallel resonator PR4 and a ground.

Simulation was performed on the duplexers DUP0 through DUP4. FIG. 8 through FIG. 12 are diagrams listing the characteristics of the resonators of the duplexers DUP0 through DUP4, respectively.

Table 1 lists the widths W and the effective electromechanical coupling coefficients $k^2$eff of the duplexers DUP0 through DUP4.

TABLE 1

| | MgHf | WST [μm] | WPT [μm] | WSR [μm] | WPR [μm] | KST [%] | KPT [%] | KSR [%] | KPR [%] |
|---|---|---|---|---|---|---|---|---|---|
| DUP0 | 0 at % | 3 | 3 | 3 | 3 | 6.9-7.3 | 6.6-7.3 | 6.7-7.1 | 6.6-7.3 |
| DUP1 | 4 at % | 3-16 | 3-17 | 3-16 | 3-16 | 6.1-8.2 | 5.6-8.3 | 6.0-8.0 | 6.2-8.0 |
| DUP2 | 9 at % | 3-26 | 3-28 | 3-27 | 3-26 | 5.9-9.2 | 4.6-9.3 | 5.1-9.0 | 5.2-8.9 |
| DUP3 | 14 at % | 3-33 | 3-37 | 6-35 | 3-32 | 4.6-10.2 | 3.6-10.2 | 4.1-9.4 | 4.7-10.0 |
| DUP4 | 20 at % | 3-35 | 4-43 | 9-39 | 3-34 | 4.6-11.1 | 2.7-11.0 | 7.1-9.7 | 4.8-11.0 |

In Table 1, MgHf represents an atomic concentration (at %) of Mg and hafnium (Hf) added to aluminum nitride of the piezoelectric film 14. WST represents the maximum value and the minimum value of the width W among the resonators ST1 through ST5, WPT represents the maximum value and the minimum value of the widths W among the resonators PT1 through PT4, WSR represents the maximum value and the minimum value of the width W among the resonators SR1 through SR4, and WPR represents the maximum value and the minimum value of the width W among the resonators PR1 through PR4. KST represents the maximum value and the minimum value of the effective electromechanical coupling coefficient $k^2$eff among the resonators ST1 through ST5, KPT represents the maximum value and the minimum value of the effective electromechanical coupling coefficient $k^2$eff among the resonators PT1 through PT4, KSR represents the maximum value and the minimum value of the effective electromechanical coupling coefficient $k^2$eff among the resonators SR1 through SR4, and KPR represents the maximum value and the minimum value of the effective electromechanical coupling coefficient $k^2$eff among the resonators PR1 through PR4.

In FIG. 8 through FIG. 12 and Table 1, DUP0 is a comparative example. In DUP0, each resonator has the same width W of 3 μm. Mg and Hf are not added to the piezoelectric film 14. The electrostatic capacitance of each resonator is optimized. As the electrostatic capacitances slightly differ from each other, the effective electromechanical coupling coefficients $k^2$eff differ from each other between the resonators, but are approximately 7%.

The widths W of the resonators differ in DUP1 through DUP4. The maximum value of the width W increases in the order of DUP1, DUP2, DUP3, and DUP4. As the width W increases, the effective electromechanical coupling coefficient $k^2$eff decreases. The additive amount of Mg and Hf increases in the order of DUP1, DUP2, DUP3, and DUP4. In resonators having the same electrostatic capacitance and the same width W, the resonator of which the additive amount is greater has higher effective electromechanical coupling coefficient $k^2$eff. Here, DUP1 through DUP4 are configured so as to have an average value of the effective electromechanical coupling coefficient $k^2$eff of approximately 7%. Accordingly, the difference between the maximum value and the minimum value of the effective electromechanical coupling coefficient $k^2$eff increases in the order of DUP1, DUP2, DUP3, and DUP4.

Figure 13A:
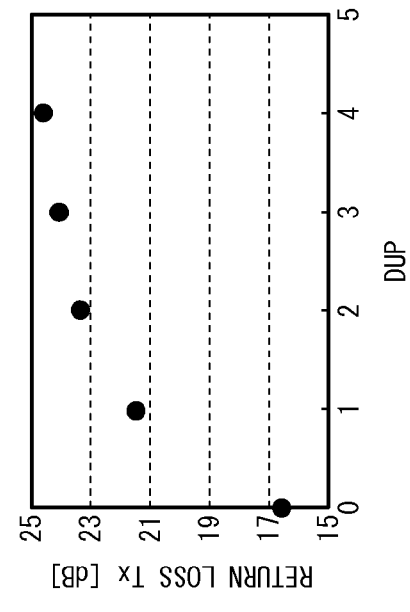
FIG. 13A through FIG. 13D are diagrams illustrating transition widths and return losses of the duplexers DUP0 through DUP4.
Figure 13B:
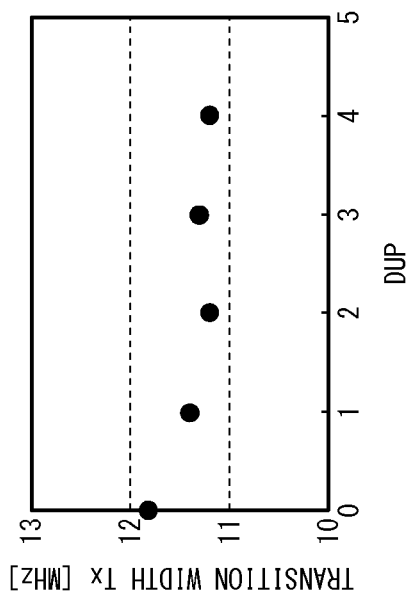
Figure 13C:
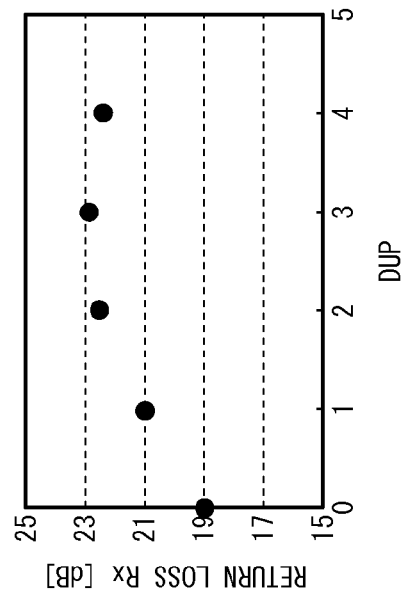
Figure 13D:
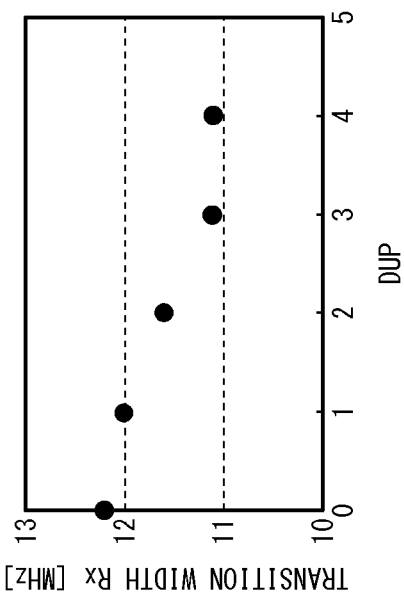

FIG. 13A through FIG. 13D are diagrams illustrating transition widths and return losses of the duplexers DUP0 through DUP4. FIG. 13A exhibits the transition width when the attenuation at the high frequency side of the transmit filter 62 is from 2.5 dB to 45 dB. FIG. 13B exhibits the return loss of the transmit filter 62. FIG. 13C exhibits the transition width when the attenuation at the low frequency side of the receive filter 64 is from 3.0 dB to 50 dB. FIG. 13D exhibits the return loss of the receive filter 64.

As illustrated in FIG. 13A and FIG. 13C, the transition width decreases in the order of DUP0, DUP1, DUP2, DUP3, and DUP4. That is to say, skirt characteristics become sharp in the order of DUP0, DUP1, DUP2, DUP3, and DUP4. As illustrated in FIG. 13B and FIG. 13D, the return loss decreases in the order of DUP0, DUP1, DUP2, DUP3, and DUP4. That is to say, matching characteristics are improved in the order of DUP0, DUP1, DUP2, DUP3, and DUP4.

As described above, the sharpness of skirt characteristics is improved and matching characteristics are improved by making the maximum value of the effective electromechanical coupling coefficient in the series resonators or in the parallel resonators high and making the difference between the maximum value and the minimum value large.

Figure 14:
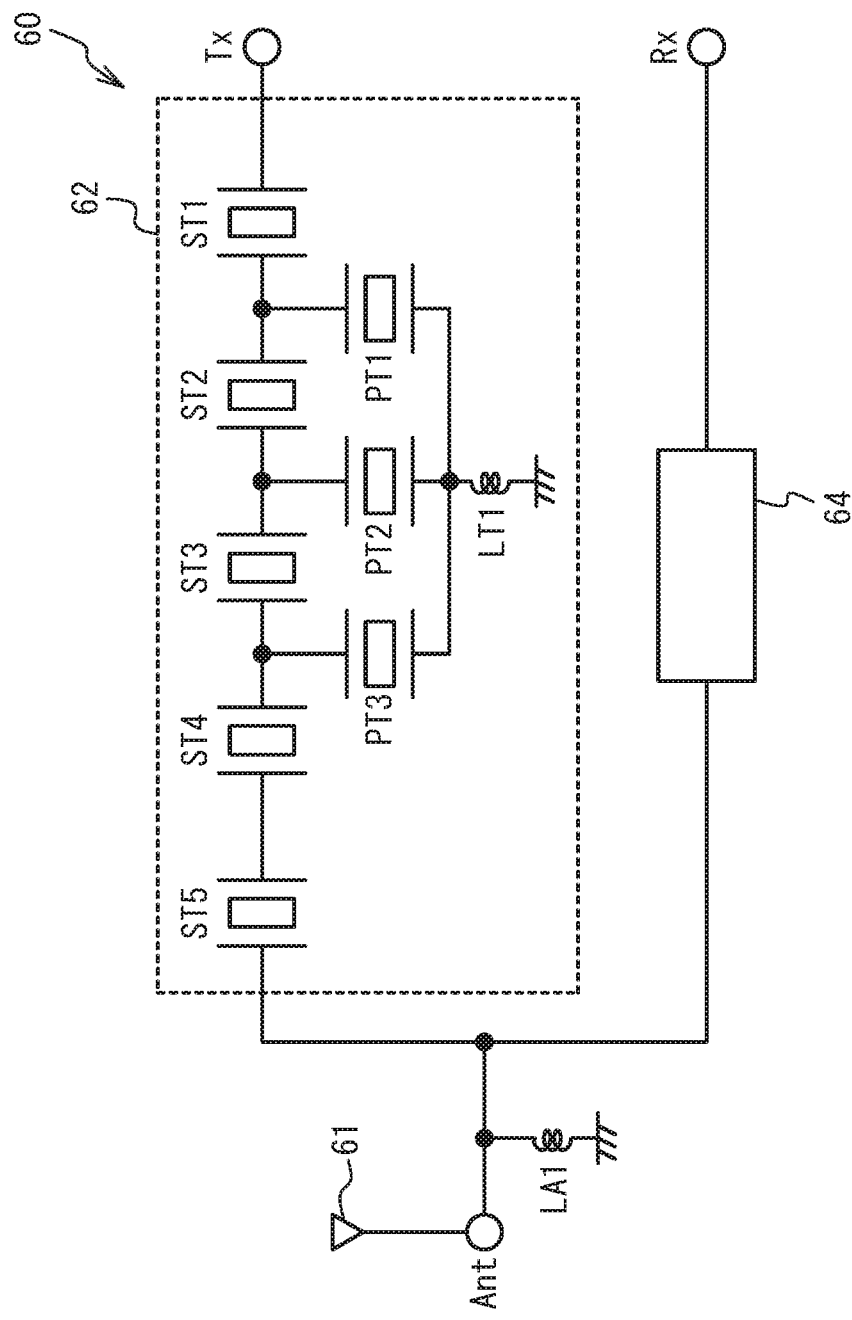
FIG. 14 is a circuit diagram of a simulated duplexer.

A description will next be given of another example of a simulation of a duplexer employing the first embodiment. FIG. 14 is a circuit diagram of a simulated duplexer. The duplexer is a duplexer for Band 7 (transmit band: 2500 to 2570 MHz, receive band: 2620 to 2690 MHz). As illustrated in FIG. 14, the series resonators ST1 through ST5 are connected in series between the common terminal Ant and the transmit terminal Tx in the transmit filter 62. The parallel resonators PT1 through PT3 are connected in parallel between the common terminal Ant and the transmit terminal Tx. The parallel resonators PT1 through PT3 are jointly grounded through the inductor LT1. The receive filter 64 is a receive filter for Band 7. Other configurations are the same as those illustrated in FIG. 7, and thus the description is omitted.

The simulation was performed on duplexers DUP5 and DUP6. Table 2 lists the electrostatic capacitances, the widths W, and the effective electromechanical coupling coefficients $k^2$eff of the resonators of the duplexers DUP5 and DUP6.

TABLE 2

| Resonator | Electrostatic Capacitance [pF] | DUP5 | | DUP6 | |
| --- | --- | --- | --- | --- | --- |
| | | $K^2$eff [%] | Width W [μm] | $K^2$eff [%] | Width W [μm] |
| ST1 | 1.4 | 6.7 | 3 | 6.3 | 6 |
| ST2 | 0.8 | 6.3 | 3 | 6.3 | 3 |
| ST3 | 0.8 | 6.3 | 3 | 6.3 | 3 |
| ST4 | 2.1 | 6.9 | 3 | 6.9 | 3 |
| ST5 | 1.1 | 6.6 | 3 | 5.7 | 11 |
| PT1 | 2.6 | 6.8 | 3 | 6.8 | 3 |
| PT2 | 1.7 | 6.7 | 3 | 6.7 | 3 |
| PT3 | 2.1 | 6.8 | 3 | 6.8 | 3 |

As listed in Table 2, in the duplexer DUP5, the resonators have the same width W. In the duplexer DUP6, the resonators ST1 and ST5 were assumed to have widths W of 6 μm and 11 μm, respectively. Other resonators have widths W of 3 μm. When the width W increases from the width of DUP5 to that of DUP6, the effective electromechanical coupling coefficient $k^2$eff decreases from 6.7% to 6.3% in the resonator ST1, and decreases from 6.6% to 5.7% in the resonator ST5.

Figure 15:
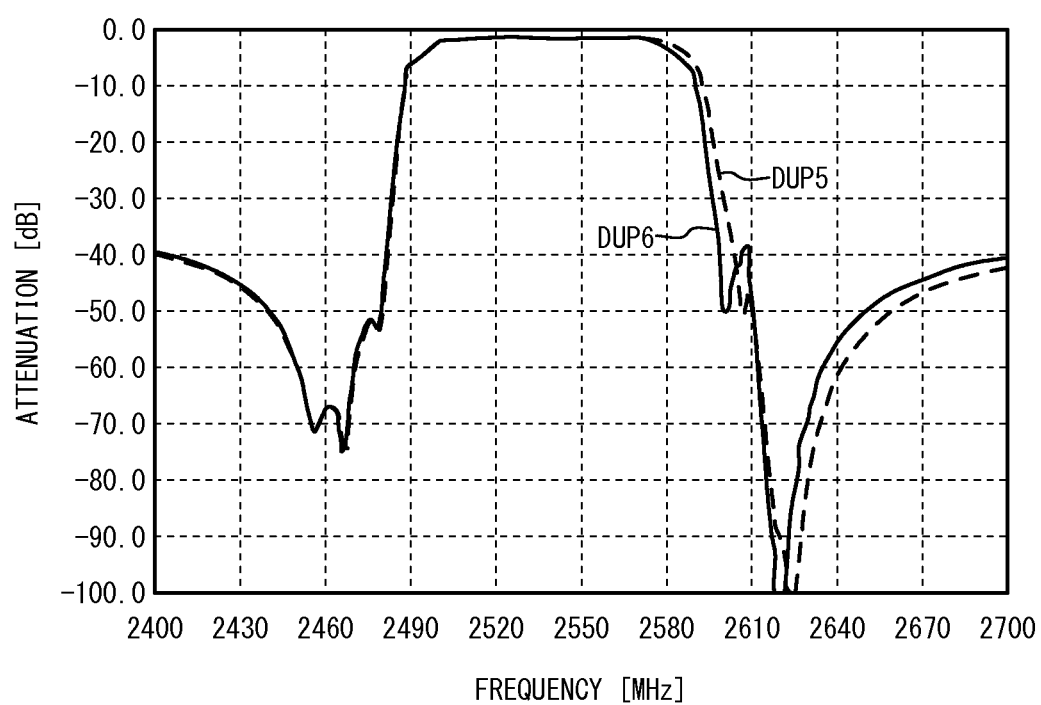
FIG. 15 is a diagram illustrating pass characteristics of transmit filters of duplexers DUP5 and DUP6.

FIG. 15 is a diagram illustrating the pass characteristics of the transmit filters of the duplexers DUP5 and DUP6. As illustrated in FIG. 15, skirt characteristics at the high frequency side are improved in the duplexer DUP6 compared to those in the duplexer DUP5. The transition width from 2.0 dB to 30 dB in attenuation is 22.1 MHz in the duplexer DUP5, and 20.5 MHz in the duplexer DUP6.

The first embodiment provides the piezoelectric thin film resonator with the insertion film 28 that is inserted in the piezoelectric film 14 and located in at least a part of the outer peripheral region 52 within the resonance region 50, but is not located in the center region 54 of the resonance region 50. This prevents the creation of unnecessary Lamb waves in a lateral mode as well as reduces acoustic wave energy from leaking to the outside of the resonance region 50. Thus, the Q-value is improved. At least two piezoelectric thin film resonators out of the piezoelectric thin film resonators in the filter 40 have different widths W of the insertion films 28 within the resonance regions 50. This enables to make the effective electromechanical coupling coefficients of the at least two piezoelectric thin film resonators differ from each other. Thus, the sharpness of the skirt characteristics of the filter 40 is improved. In addition, the first embodiment changes the width W of the insertion film 28 to change the effective electromechanical coupling coefficient, thus preventing the increase in the number of fabrication steps.

In addition, as demonstrated by the duplexers DUP1 through DUP4, at least two resonators of series resonators have different widths W of the insertion films 28 within the resonance regions 50, and at least two resonators of parallel resonators have different widths W. This improves skirt characteristics.

As demonstrated by the duplexer DUP6, at least two resonators of series resonators have different widths W of the insertion films 28 within the resonance regions 50, but parallel resonators may have the same widths W. Characteristics at the high frequency side of the passband mainly depend on the characteristics of the series resonator. Thus, in the transmit filter of which the guard band is located at the high frequency side of the pass band, it is preferable to make the series resonators have different widths W to improve skirt characteristics at the high frequency side.

At least two resonators of parallel resonators have different widths W of the insertion films 28 within the resonance region 50, but series resonators may have the same width W. Characteristics at the low frequency side of the passband mainly depend on the characteristics of the parallel resonator. Thus, in the receive filter of which the guard band is located at the low frequency side, it is preferable to make the parallel resonators have different widths W to improve skirt characteristics at the low frequency side.

As demonstrated by DUP1 through DUP4 in Table 1, the difference between the maximum value and the minimum value of the effective electromechanical coupling coefficient among the series resonators is preferably 1% or greater, more preferably 2% or greater, and yet more preferably 5% or greater, or/and the difference between the maximum value and the minimum value of the effective electromechanical coupling coefficient among the parallel resonators is preferably 1% or greater, more preferably 2% or greater, and yet more preferably 5% or greater.

As illustrated in FIG. 9 through FIG. 12, the resonators in the series resonators preferably have different resonant frequencies, or/and the resonators in the parallel resonators preferably have different resonant frequencies.

As demonstrated by DUP1 through DUP4, the resonator that has the smallest width W of the insertion film 28 among the series resonators is a resonator located closest to the input terminal or the output terminal among the series resonators. Furthermore, the resonator that has the second smallest width W of the insertion film 28 among the series resonators is a resonator located closest to the input terminal or the output terminal among the series resonators. This makes the skirt characteristics of the filter sharp.

The resonator that has the smallest width W of the insertion film 28 among the parallel resonators is a resonator located closest to the input terminal or the output terminal among the parallel resonators. This enables to make the skirt characteristics of the filter sharp.

In addition, the resonator that has the greatest width W of the insertion film 28 among the series resonators is not a resonator located closest to the input terminal or the output terminal among the series resonators. The resonator that has the greatest width W of the insertion film 28 among the parallel resonators is not a resonator located closest to the input terminal or the output terminal among the parallel resonators.

As demonstrated by DUP6, the resonator that has the greatest width W of the insertion film 28 among the series resonators is a resonator located closest to the input terminal or the output terminal among the series resonators. Furthermore, the resonator that has the second greatest width W of the insertion film 28 among the series resonators is a resonator located closest to the input terminal or the output terminal among the series resonators. The parallel resonators may be configured as the same. This enables to make the skirt characteristics of the filter sharp.

As illustrated in FIG. 4A, to improve the Q-value of the piezoelectric thin film resonator, the insertion film 28 preferably has a Young's modulus less than that of the piezoelectric film 14.

When the piezoelectric film 14 is mainly composed of aluminum nitride, the insertion film is preferably mainly composed of at least one of Al, Au, Cu, Ti, Pt, Ta, Cr, and silicon oxide.

When the piezoelectric film 14 is mainly composed of aluminum nitride, the piezoelectric film 14 preferably includes an element increasing the piezoelectric constant of the piezoelectric film 14.

As illustrated in FIG. 2A through FIG. 2D, the insertion film 28 is located from at least a part of the outer peripheral region 52 to the outside of the resonance region 50. This enables to prevent the crack of the piezoelectric film 14 in the outer periphery of the resonance region 50.

The first embodiment is an exemplary ladder-type filter, but the filter 40 may be a filter other than the ladder-type filter. In the filter other than the ladder-type filter, effective electromechanical coupling coefficients can be easily made to differ from each other by making the widths W of the insertion films 28 of piezoelectric thin film resonators different from each other. This enables to improve the sharpness of the skirt characteristics of the filter, for example.

In the duplexer 60, at least one of the transmit filter 62 and the receive filter 64 is required to be the filter 40 of the first embodiment. One of the transmit filter 62 and the receive filter 64 may be a multimode type filter.

Figure 16A:
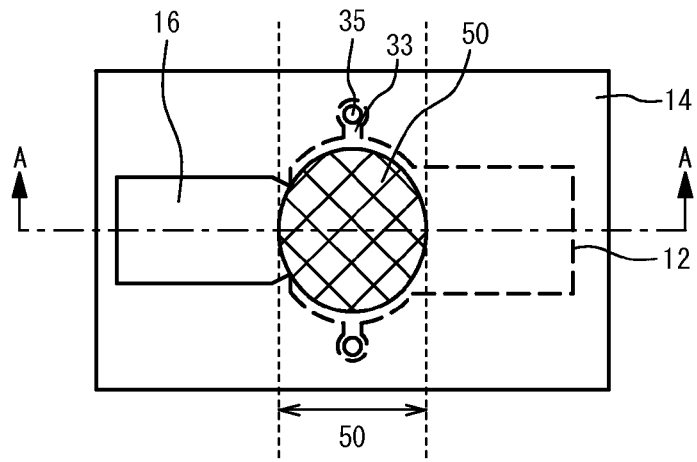
FIG. 16A is a plan view of a piezoelectric thin film resonator in accordance with a first variation of the first embodiment.
Figure 16B:
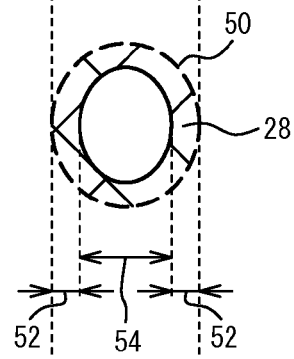
FIG. 16B is a plan view of an insertion film.
Figure 16C:
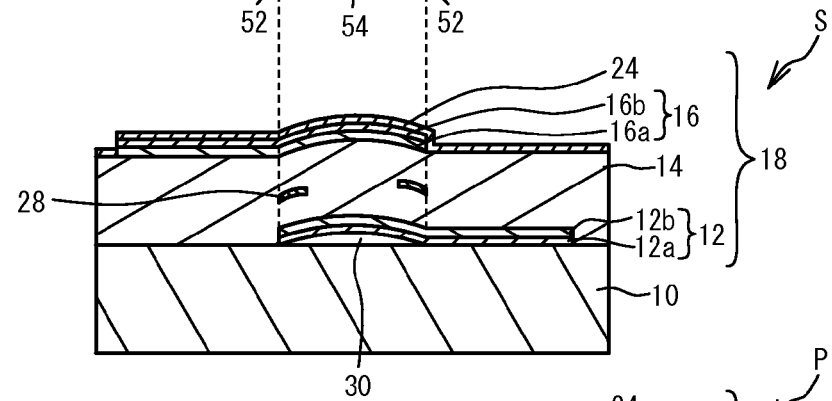
FIG. 16C and FIG. 16D are cross-sectional views taken along line A-A in FIG. 16A.
Figure 16D:
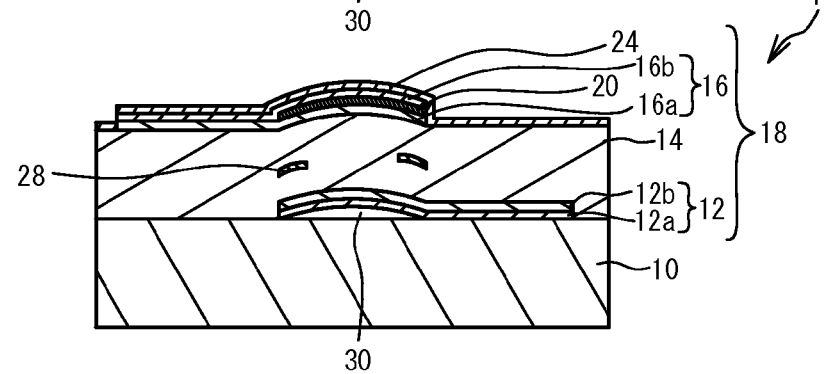

A description will be given of a piezoelectric thin film resonator having a structure different from that of the first embodiment. FIG. 16A is a plan view of a piezoelectric thin film resonator of a first variation of the first embodiment, FIG. 16B is a plan view of an insertion film, and FIG. 16C and FIG. 16D are cross-sectional views taken along line A-A in FIG. 16A. FIG. 16C is a cross-sectional view of a series resonator, and FIG. 16D is a cross-sectional view of a parallel resonator. As illustrated in FIG. 16A through FIG. 16D, the insertion film 28 is formed in the resonance region 50, but is not formed outside the resonance region 50. Other structures are the same as those of the first embodiment, and thus the description is omitted.

Figure 17A:
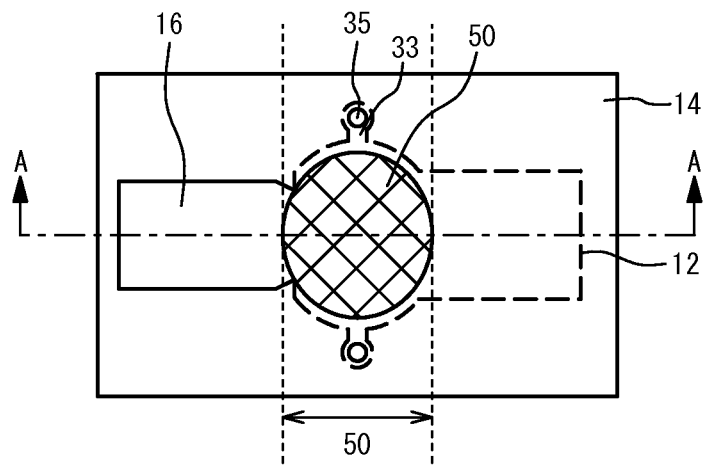
FIG. 17A is a plan view of a piezoelectric thin film resonator in accordance with a second variation of the first embodiment.
Figure 17B:
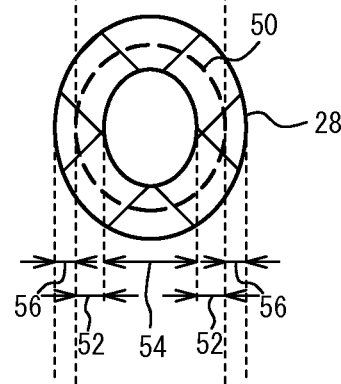
FIG. 17B is a plan view of an insertion film.
Figure 17C:
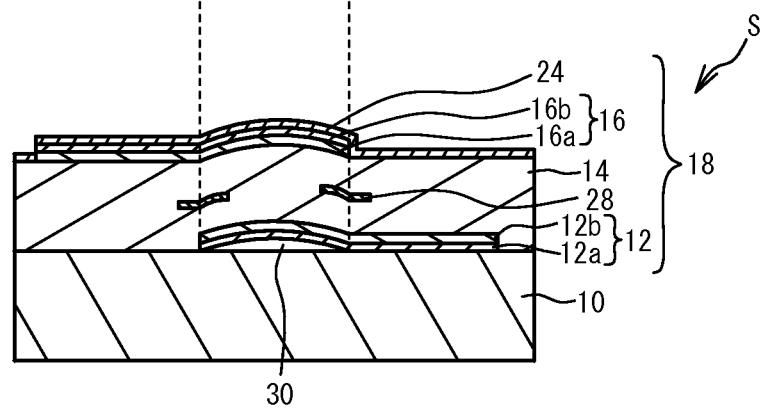
FIG. 17C is a cross-sectional view taken along line A-A in FIG. 17A.

FIG. 17A is a plan view of a piezoelectric thin film resonator of a second variation of the first embodiment, FIG. 17B is a plan view of an insertion film, and FIG. 17C is a cross-sectional view taken along line A-A in FIG. 17A. FIG. 17C is a cross-sectional view of a series resonator. As illustrated in FIG. 17A through FIG. 17C, the insertion film 28 is formed in a region 56 surrounding the resonance region 50 as well as in the outer peripheral region 52. Other structures are the same as those of the first variation of the first embodiment, and thus the description is omitted.

As described in the first embodiment, the insertion film 28 may be formed in the entire surface outside the resonance region 50. As described in the first variation, the insertion film 28 may not be formed outside the resonance region 50. As described in the second variation, the insertion film 28 may be formed in the region 56 surrounding the resonance region 50, and may not be formed outside the region 56. In any of the above described cases, the Q-value of the piezoelectric thin film resonator can be improved. Accordingly, skirt characteristics can be made to be sharp.

Figure 18A:
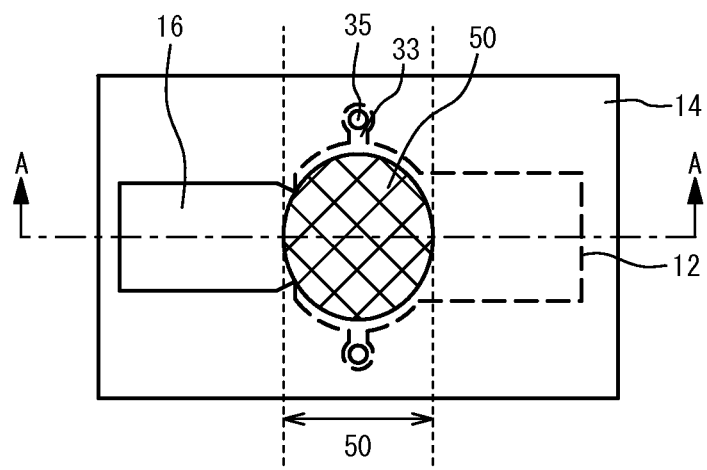
FIG. 18A is a plan view of a piezoelectric thin film resonator in accordance with a third variation of the first embodiment.
Figure 18B:
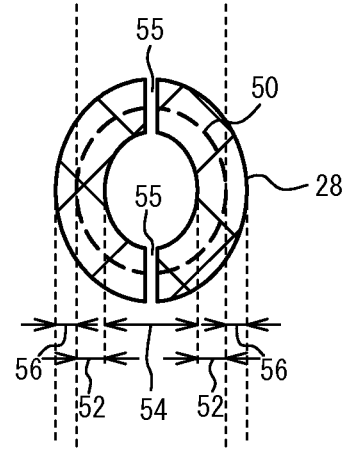
FIG. 18B is a plan view of an insertion film.
Figure 18C:
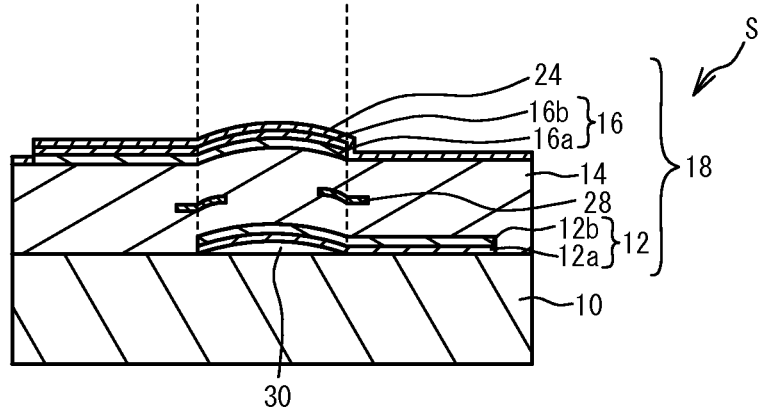
FIG. 18C is a cross-sectional view taken along line A-A in FIG. 18A.

FIG. 18A is a plan view of a piezoelectric thin film resonator of a third variation of the first embodiment 3, FIG. 18B is a plan view of an insertion film, and FIG. 18C is a cross-sectional view taken along line A-A in FIG. 18A. FIG. 18C is a cross-sectional view of a series resonator. As illustrated in FIG. 18A through FIG. 18C, the insertion film 28 is formed in a part of the outer peripheral region 52, but the insertion film 28 is not formed in a part 55 of the outer peripheral region 52. Other structures are the same as those of the second variation of the first embodiment, and thus the description is omitted.

As described in the third variation of the first embodiment, the insertion film 28 is required to be located in a part of the outer peripheral region 52. Even when the insertion film 28 is located in a part of the outer peripheral region 52, leakage of the acoustic wave to the outside of the resonance region 50 is reduced. The insertion film 28 is preferably located in 50% or more of the outer periphery of the resonance region 50, more preferably 75% or more, and yet more preferably 90% or more.

The insertion film 28 may not be located in the part 55 of the outer peripheral region 52 in the piezoelectric thin film resonator of the first embodiment, or the first and second variations of the first embodiment.

Figure 19A:
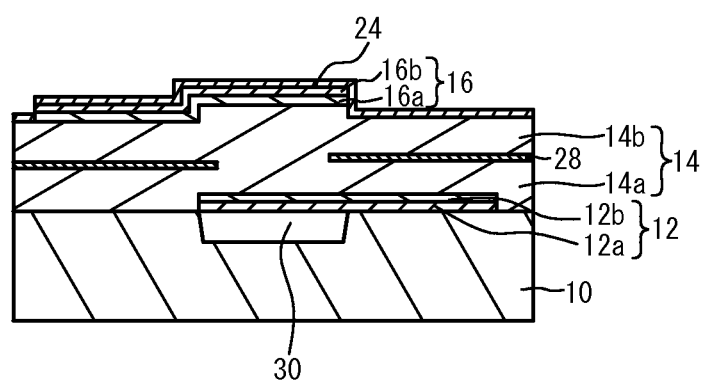
FIG. 19A is a cross-sectional view of a piezoelectric thin film resonator in accordance with a fourth variation of the first embodiment.
Figure 19B:
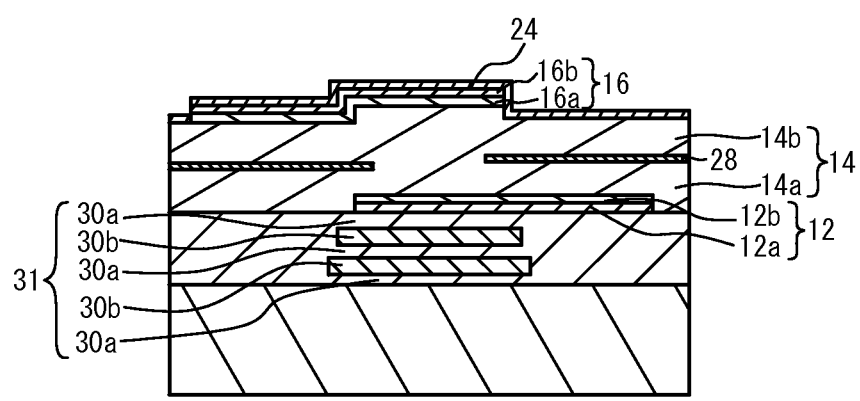
FIG. 19B is a cross-sectional view of a piezoelectric thin film resonator in accordance with a fifth variation of the first embodiment.

Fourth and fifth variations of the first embodiment change the structure of the air-space. FIG. 19A is a cross-sectional view of a piezoelectric thin film resonator of the fourth variation of the first embodiment, and FIG. 19B is a cross-sectional view of a piezoelectric thin film resonator of the fifth variation of the first embodiment. As illustrated in FIG. 19A, a recessed portion is formed in the upper surface of the substrate 10. The lower electrode 12 is flatly formed on the substrate 10. Accordingly, the air-space 30 is formed in the recessed portion of the substrate 10. The air-space 30 is formed so as to include the resonance region 50. Other structures are the same as those of the first embodiment, and thus the description is omitted. The air-space 30 may be formed so as to penetrate through the substrate 10. An insulating film may be formed so as to come in contact with the lower surface of the lower electrode 12. That is to say, the air-space 30 may be formed between the substrate 10 and the insulating film making contact with the lower electrode 12. The insulating film may be made of, for example, an aluminum nitride film.

As illustrated in FIG. 19B, an acoustic mirror 31 is formed under the lower electrode 12 of the resonance region 50. The acoustic mirror 31 is formed by alternately stacking a film 30a with low acoustic impedance and a film 30b with high acoustic impedance. The films 30a and 30b have film thicknesses of $\lambda/4$ ($\lambda$ is the wavelength of an acoustic wave). The number of stacking of the films 30a and 30b are freely selected. Other structures are the same as those of the first embodiment, and thus the description is omitted.

In the fourth and fifth variations of the first embodiment, the insertion film 28 may be formed only in the resonance region 50 as described in the first variation of the first embodiment. The insertion film 28 is formed in the region 56 surrounding the resonance region 50, and may not be formed outside the region 56 as described in the second variation of the first embodiment. The insertion film 28 may be formed only in a part of the outer peripheral region 52 as described in the third variation of the first embodiment.

As described in the first embodiment and the first through fourth variations, the piezoelectric thin film resonator may be a Film Bulk Acoustic Resonator (FBAR) having the air-space 30 formed between the substrate 10 and the lower electrode 12 in the resonance region 50. Moreover, as described in the fifth variation of the first embodiment, the piezoelectric thin film resonator may be a Solidly Mounted Resonator (SMR) including the acoustic mirror 31, which reflects an acoustic wave propagating through the piezoelectric film 14, under the lower electrode 12 in the resonance region 50.

In the first embodiment and its variations, the resonance region 50 has a shape of an ellipse, but may have other shape. For example, the resonance region 50 may have a polygonal shape such as quadrangle or pentagon.

Although the embodiments of the present invention have been described in detail, it is to be understood that the various change, substitutions, and alterations could be made hereto without departing from the spirit and scope of the invention.

What is claimed is:

1. A filter comprising:
piezoelectric thin film resonators, each including a substrate, a piezoelectric film located on the substrate, a lower electrode and an upper electrode facing each other across at least a part of the piezoelectric film, and an insertion film inserted in the piezoelectric film, located in at least a part of an outer peripheral region within a resonance region, and not located in a center region of the resonance region, the resonance region being a region where the lower electrode and the upper electrode face each other across the piezoelectric film, wherein at least two piezoelectric thin film resonators out of the piezoelectric thin film resonators have different widths of the insertion films within the resonance regions.

2. The filter according to claim 1, wherein
the piezoelectric thin film resonators include at least one series resonator and at least one parallel resonator, the at least one series resonator being connected in series between an input terminal and an output terminal, the at least one parallel resonator being connected in parallel between the input terminal and the output terminal.

3. The filter according to claim 2, wherein
at least two resonators among the at least one series resonator have different widths of the insertion films within the resonance regions, and/or at least two resonators among the at least one parallel resonator have different widths of the insertion films within the resonance regions.

4. The filter according to claim 3, wherein
a difference between a maximum value and a minimum value of an effective electromechanical coupling coefficient is 1% or greater in the at least two resonators among the at least one series resonator, and/or a difference between a maximum value and a minimum value of an effective electromechanical coupling coefficient is 1% or greater in the at least two resonators among the at least one parallel resonator.

5. The filter according to claim 3, wherein
the at least two resonators among the at least one series resonator have different resonant frequencies and/or the at least two resonators among the at least one parallel resonator have different resonant frequencies.

6. The filter according to claim 1, wherein
the insertion film has a Young's modulus less than a Young's modulus of the piezoelectric film.

7. The filter according to claim 1, wherein
the piezoelectric film is mainly composed of aluminum nitride.

8. The filter according to claim 7, wherein
the piezoelectric film includes an element increasing a piezoelectric constant of the piezoelectric film.

9. The filter according to claim 7, wherein
the insertion film is mainly composed of at least one of Al, Au, Cu, Ti, Pt, Ta, Cr, and silicon oxide.

10. A duplexer comprising:
a transmit filter; and
a receive filter, wherein
at least one of the transmit filter and the receive filter is the filter according to claim 1.

* * * * *